United States Patent
Kaneko et al.

(10) Patent No.: US 6,819,817 B2
(45) Date of Patent: Nov. 16, 2004

(54) OPTICAL SIGNAL STORAGE

(75) Inventors: Yasuhisa Kaneko, Kanagawa (JP); You Kondoh, Yamato (JP)

(73) Assignee: Agilent Technologies, Inc., Palo Alto, CA (US)

( * ) Notice: Subject to any disclaimer, the term of this patent is extended or adjusted under 35 U.S.C. 154(b) by 165 days.

(21) Appl. No.: 10/173,060

(22) Filed: Jun. 17, 2002

(65) Prior Publication Data

US 2003/0007230 A1 Jan. 9, 2003

(30) Foreign Application Priority Data

Jun. 20, 2001 (JP) ........................................ 2001-185900

(51) Int. Cl.[7] .......................... G02F 1/295; G02B 6/28; G02B 6/00
(52) U.S. Cl. .............................. 385/16; 385/5; 385/24; 385/122; 385/131
(58) Field of Search ............................ 385/14–16, 24, 385/27, 39, 49, 122, 129–131, 141, 4, 5

(56) References Cited

U.S. PATENT DOCUMENTS

| | | | |
|---|---|---|---|
| 3,700,307 A | | 10/1972 | Glenn |
| 5,278,855 A | * | 1/1994 | Jacobovitz-Veselka et al. ........................ 372/44 |
| 5,303,256 A | | 4/1994 | Sumida |
| 5,533,154 A | | 7/1996 | Smith |
| 5,566,261 A | * | 10/1996 | Hall et al. .................... 385/27 |
| 5,615,290 A | | 3/1997 | Harasawa et al. |
| 5,862,286 A | | 1/1999 | Imanishi et al. |
| 6,035,081 A | * | 3/2000 | Poustie et al. ................ 385/27 |
| 6,169,625 B1 | | 1/2001 | Watanabe et al. |
| 6,571,028 B1 | * | 5/2003 | LoCascio et al. ............. 385/16 |
| 2002/0037148 A1 | | 3/2002 | Fields et al. |

FOREIGN PATENT DOCUMENTS

| | | |
|---|---|---|
| JP | 5100277 | 4/1993 |
| JP | 6088982 | 3/1994 |
| JP | 6235945 | 8/1994 |
| JP | 2000149583 | 5/2000 |

* cited by examiner

*Primary Examiner*—Akm Enayet Ullah
*Assistant Examiner*—Omar Rojas

(57) ABSTRACT

Optical signal storage devices are described. In one aspect, an optical signal storage device includes an optical memory loop and a substrate. The substrate carries an input optical port, an output optical port, an optical signal path that is coupled between the input and output optical ports, an optical memory path that is coupled to complete the optical memory loop, and an optical read/write controller that is coupled between the optical signal path and the optical memory path. The optical read/write controller is operable to selectively transmit light between the optical signal path and the optical memory path based on received control light. In another aspect, the optical read/write controller comprises at least one saturable absorber optical switch having a transmittance that varies nonlinearly with received light intensity so that light is selectively transmittable between the optical memory loop and the input and output optical ports based on received control light.

23 Claims, 3 Drawing Sheets

OPTICAL SIGNAL STORAGE

CROSS-REFERENCE TO RELATED APPLICATIONS

Under 35 U.S.C. § 119 this application claims the benefit of co-pending Japanese Patent Application No. 2001-185900, which was filed Jun. 20, 2001, and is incorporated herein by reference.

BACKGROUND

Systems that store optical signals are key building blocks in optical communication systems and in optical computing systems. In general, optical signal storage systems enable optical signals to be modified (e.g., path alteration or signal reshaping), stored, and delayed. For example, an optical signal must be temporarily stored if the information in the signal is to be read out directly at a relay station within a network. An optical storage delay line also is needed to enable the waveform of an optical signal to be measured.

A variety of different optical memory systems have been proposed. For example, several types of serial optical signal storage systems have been demonstrated using recirculating optical fiber loops. These optical memory designs are either pulse-preserving, where the same optical pulses propagate on each circulation of the storage loop, or regenerative where the pulses are replaced after some number of memory circulations.

One type of optical memory system includes an optical fiber loop and a switch that couples optical signals into and out of the optical fiber loop. The optical switching function may be provided by an electrically-controlled optical switch or by an optical coupler. For example, U.S. Pat. No. 5,533,154 describes an optical memory in which optical signals may be written to or read from a loop mirror switch by an optical coupler that may be selectively changed between a reflecting mode and a coupling mode by a polarization controller. U.S. Pat. No. 6,035,081 describes an optical memory in which the optical switching element is an interferometric non-linear switch with an optical amplifier as the non-linear element. In this optical memory, the optical switching element is a terahertz optical asymmetric demultiplexer that is responsive to switching pulses from an optical source to allow data to be switched out of an optical loop.

U.S. Pat. No. 5,862,286 describes another type of optical memory device that includes two nonlinear optical media and two mirrors that are arranged to reflect light between the two nonlinear optical media. In this optical memory device, a first mirror reflects light passing through a first nonlinear optical medium and into the second nonlinear optical medium. The second mirror reflects part of the light reflected from the second nonlinear optical medium back into the first nonlinear optical medium.

SUMMARY

The invention features a optical signal storage scheme that may be implemented in a device that has a relatively small size and is capable of maintaining high optical signal storage quality with relatively little signal attenuation.

In one aspect, the invention features an optical signal storage device that includes an optical memory loop and a substrate. The substrate carries an input optical port, an output optical port, an optical signal path that is coupled between the input and output optical ports, an optical memory path that is coupled to complete the optical memory loop, and an optical read/write controller that is coupled between the optical signal path and the optical memory path. The optical read/write controller is operable to selectively transmit light between the optical signal path and the optical memory path based on received control light.

In another aspect of the invention, an optical signal storage device includes an input optical port, an output optical port, an optical memory loop, and an optical read/write controller that is coupled between the optical memory loop and the input and output optical ports. The optical read/write controller comprises at least one saturable absorber optical switch having a transmittance that varies nonlinearly with received light intensity so that light is selectively transmittable between the optical memory loop and the input and output optical ports based on received control light.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
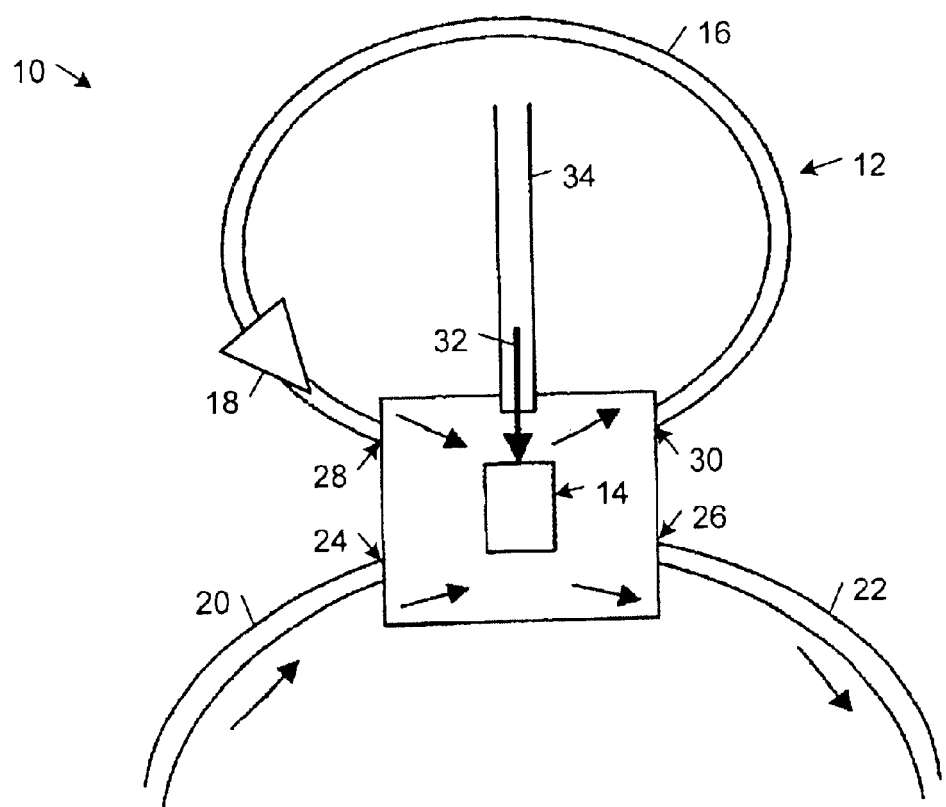
FIG. 1 is a diagrammatic view of an optical signal storage device.

Referring to FIG. 1, in some embodiments, an optical signal storage device 10 includes an optical memory loop 12 and a read/write controller 14. The optical memory loop may be implemented in the form of a looped optical fiber 16 and may include an optical signal amplifier 18 (e.g., an erbium-doped fiber amplifier). The read/write controller 14 is coupled to an input optical fiber 20 and an output optical fiber 22 through an input optical port 24 and an output optical port 26, respectively. The read/write controller 14 is coupled to the optical memory loop 12 through a pair of optical ports 28, 30. The read/write controller 14 is operable to selectively transmit light between the optical memory loop 12 and the input and output optical ports 24, 26 based on control light 32 that is received from a light guide 34. In some embodiments, one or more optical components (e.g., lenses) may be provided to focus control light 32 onto a selected location of read/write controller 14. In operation, read/write controller 14 controls whether light signals are written into optical memory loop 12 from input optical port 24 or read from optical memory loop 12 into output optical port 26 based upon control light 32.

Figure 2:
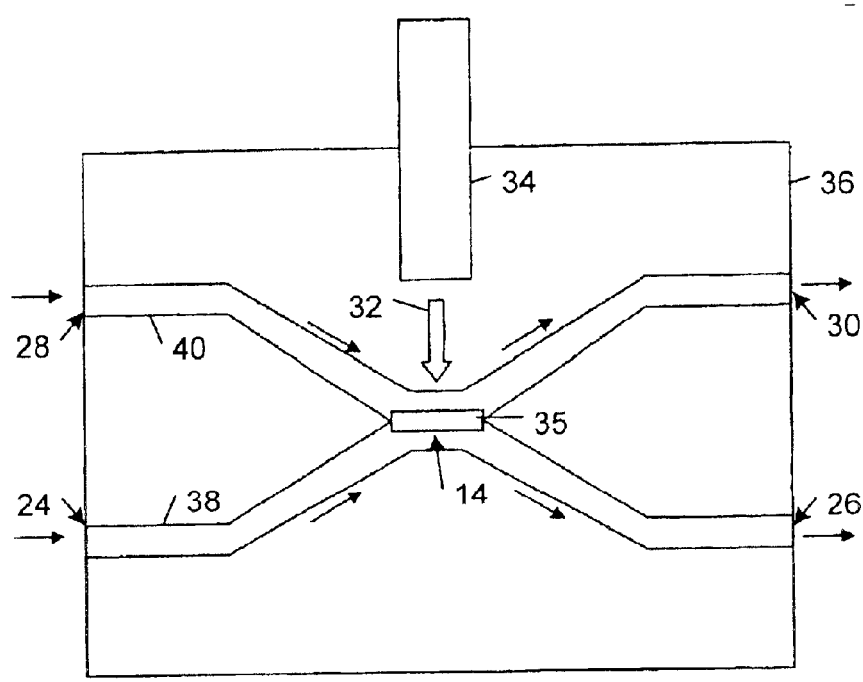
FIG. 2 is a diagrammatic top view of an implementation of the optical signal storage device of FIG. 1.

Referring to FIG. 2, in some implementations of the embodiments of FIG. 1, read/write controller 14 includes an optical switch 35 that is carried on a substrate 36. Substrate 36 also carries the input and output optical ports 24, 26, the optical memory loop optical ports 28, 30, an optical signal path 38 that is coupled between the input and output optical ports 24, 26, and an optical memory path 40 that is coupled to complete the optical memory loop 12. In general, substrate 36 may be formed from any suitable substrate material, including any semiconductor, glass, plastic or ceramic material, and optical paths 38, 40 may be formed from any suitable optical waveguide material.

In these implementations, optical switch 35 preferably is a saturable absorber optical switch having a transmittance that increases with received light intensity. In particular, a saturable absorber optical switch attenuates light of low optical power and transmits light of high optical power due to absorption saturation. In some embodiments, the saturable absorber optical switch is implemented in the form of a semiconductor optical element with a nonlinear input-to-output power characteristic. In these embodiments, the saturable absorber optical switch may be formed of InGaAs, InAlAs, InAlGaAs, InAsP, InGaAsP, GaAsSb, AlGaAsSb, AlGaAs, GaAs, SiGeC, and InP. In one exemplary embodiment, the saturable absorber optical switch is a doped (e.g., Be-doped) InGaAs saturable absorber optical switch that is formed monolithically on an InP substrate 36, and optical paths 38, 40 are formed from one or more of InP, InGaAsP, and InAlGaAs. Other exemplary material systems for implementing optical storage device 10 are summarized in Table 1, below.

TABLE 1

| Example | Substrate | Saturable Absorber | Waveguide | Operating Wavelength ($\mu$m) |
|---|---|---|---|---|
| 1 | InP | InGaAs | InAlGaAs | ~1.56 |
| 2 | InP | InGaAsP | InGaAsP | ~1.56 |
| 3 | InP | GaAsSb | AlGaAsSb (or InAlGaAs) | ~1.56 |
| 4 | Si | SiGe | SiGeC | ~1.56 |
| 5 | GaAs | GaAs | AlGaAs | ~0.85 |

Standard semiconductor fabrication techniques may be used to fabricate the above-described embodiments.

In operation, control light 32 that has sufficient intensity to generate electron-hole pairs within the saturable absorber optical switch is used to selectively write optical signals into and read optical signals out of optical memory loop 12. For example, the saturable absorber optical switch is substantially opaque with respect to the optical signals unless control light 32 is delivered to the saturable absorber optical switch, in which case the saturable optical absorber switch is substantially transmissive with respect to optical signals. When optical signals are to be written from input optical fiber 20 to optical memory loop 12, control light 32 is delivered to the saturable absorber optical switch. In some embodiments, the control light 32 is directed substantially perpendicularly to the substrate 36. Based on the received control light 32, the saturable absorber optical switch becomes transmissive, enabling optical signals to pass from optical signal path 38 to optical memory path 40. No control light is delivered to the saturable absorber optical switch when optical signals are to be stored within optical memory loop 12 so that the stored optical signals remain circulating within the optical memory loop 12. When optical signals are to be read out of optical memory loop 12, control light 32 is delivered to the saturable absorber optical switch. Based on the received control light 32, the saturable absorber optical switch becomes transmissive, enabling stored optical signals to pass from the optical memory path 40 to the optical signal path 38.

The read/write controller 14 in the embodiments of FIGS. 1 and 2 includes only a single optical switching element for performing both reading and writing operations. In other embodiments, read/write controller may include multiple optical switching elements.

Figure 3:
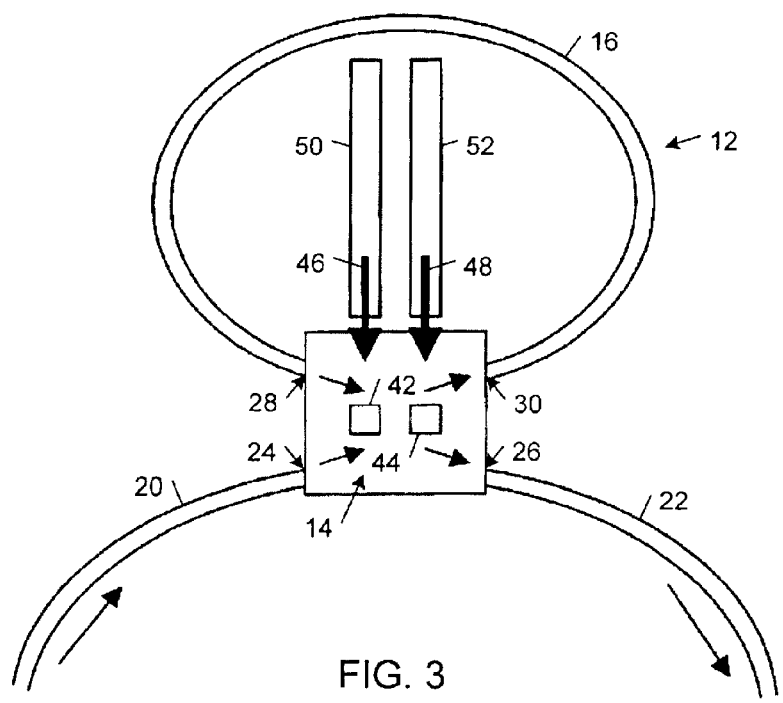
FIG. 3 is a diagrammatic view of an optical signal storage device.

Referring to FIG. 3, for example, in some embodiments, read/write controller 14 may include a write optical switch 42 for writing optical signals from input optical fiber 20 to optical memory loop 12 and a read optical switch 44 for reading stored optical signals from optical memory loop 12 to output optical fiber 22. Write optical switch 42 and read optical switch 44 may be controlled by respective control light signals 46, 48 that are delivered by respective control light guides 50, 52. In these embodiments, the process of writing optical signals to optical memory loop 12 may be performed independently of the process of reading optical signals from optical memory loop 12.

Figure 4:
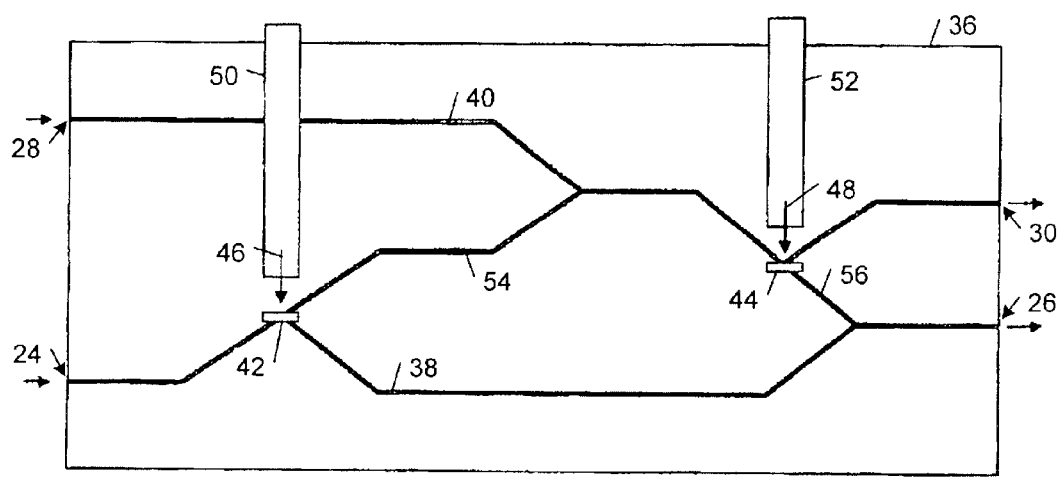
FIG. 4 is a diagrammatic top view of an implementation of the optical signal storage device of FIG. 3.

As shown in FIG. 4, in some implementations of the embodiments of FIG. 3, write and read optical switches 42, 44 may be carried on a substrate 36. Substrate 36 also carries the input and output optical ports 24, 26, the optical memory loop optical ports 28, 30, an optical signal path 38 that is coupled between the input and output optical ports 24, 26, and an optical memory path 40 that is coupled to complete the optical memory loop 12. In addition, substrate 36 carries an input optical path 54 that is coupled between write optical switch 42 and optical memory path 40, and an output optical path 56 that is coupled between the optical memory path 40 and optical signal path 38. In general, substrate 36 may be formed from any suitable substrate material, including any semiconductor, glass, plastic or ceramic material, and optical paths 38, 40 may be formed from any suitable optical waveguide material.

In these implementations, each of write and read optical switches 42, 44 may be implemented as a saturable absorber optical switch having a transmittance that increases nonlinearly with received light intensity, or a saturable transmitter. In particular, a saturable absorber optical switch is configured to transmit an attenuated output signal based on input light of low optical power, whereas the saturable absorber optical switch is configured to transmit light of high optical power without substantial attenuation due to absorption saturation. In some embodiments, the saturable absorber optical switch is implemented in the form of a semiconductor optical element with a nonlinear input-to-output power characteristic. In these embodiments, the saturable absorber optical switch may be formed of InGaAs, InAlAs, InAlGaAs, InAsP, InGaAsP, GaAsSb, AlGaAsSb, AlGaAs, GaAs, SiGeC, and InP. In one exemplary embodiment, the saturable absorber optical switch is a doped (e.g., Be-doped) InGaAs saturable absorber optical switch that is formed monolithically on an InP substrate 36, and optical paths 38, 40 are formed from one or more of InP, InGaAsP, and InAlGaAs. Other exemplary material systems for implementing optical storage device 10 are summarized in Table 1, above. Standard semiconductor fabrication techniques may be used to fabricate these embodiments.

Figure 5:
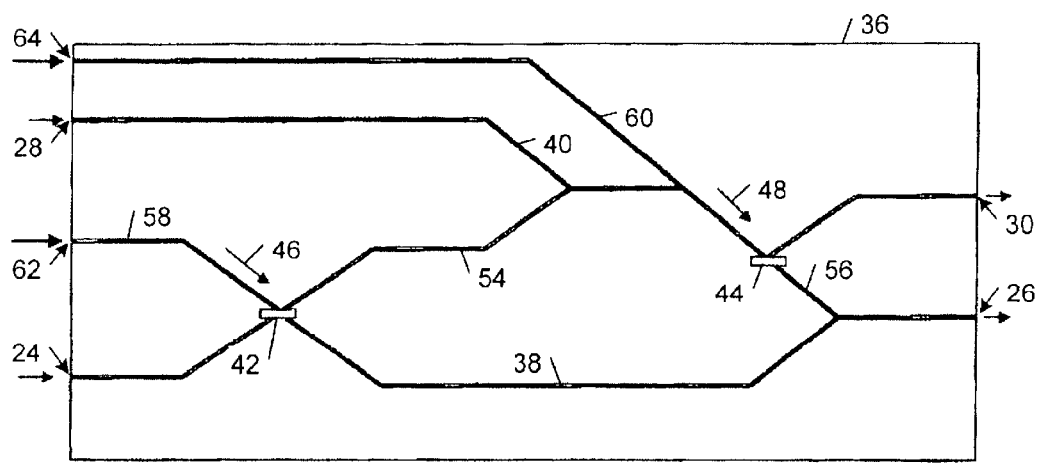
FIG. 5 is a diagrammatic top view of another implementation of the optical signal storage device of FIG. 3.

Referring to FIG. 5, in other implementations of the embodiments of FIG. 3, the control light guides are integrated onto substrate 36 to form a single monolithic structure. In these implementations, control light paths 58, 60 (e.g., optical waveguides of the same or similar construction as optical paths 38, 40, 54, 56) may be formed on substrate 36 and constructed and arranged to guide control light 46, 48 to write optical switch 42 and read optical switch 44, respectively. Control light 46, 48 may be supplied by an external control light source through respective control light optical ports 62, 64. The construction and operation of these implementations is otherwise the same as the construction and operation of the implementations of FIG. 4.

Other embodiments are within the scope of the claims.

What is claimed is:

1. An optical signal storage device, comprising:

an optical memory loop; and a substrate carrying an input optical port, an output optical port, an optical signal path coupled between the input and output optical ports, an optical memory path coupled to complete the optical memory loop, and an optical read/write controller coupled between the optical signal path and the optical memory path and operable to selectively transmit light between the optical signal path and the optical memory path based on received control light, wherein the optical read/write controller comprises at least one saturable absorber optical switch having a transmittance that varies nonlinearly with received light intensity.

2. The device of claim 1, wherein the saturable absorber optical switch comprises an InP substrate and a saturable absorption region formed from one or more of InGaAs, InGaAsP, and GaAsSb.

3. The device of claim 1, wherein the saturable absorber optical switch comprises a Si substrate and a saturable absorption region formed from SiGe.

4. The device of claim 1, wherein the saturable absorber optical switch comprises GaAs substrate and a saturable absorption region formed from GaAs.

5. The device of claim 1, wherein the optical read/write controller is constructed and arranged to receive control light directed substantially perpendicularly to a surface of the substrate.

6. The device of claim 1, wherein the optical read/write controller comprises an optical switch coupled between the optical signal path and the optical memory path and operable to selectively pass optical signals between the optical signal path and the optical memory loop based on received control light.

7. The device of claim 1, wherein the optical read/write controller comprises:

a first optical switch coupled between optical signal path and the optical memory path and operable to selectively pass optical signals from the optical signal path to the optical memory path based on received control light; and a second optical switch coupled between optical signal path and the optical memory path and operable to selectively pass optical signals from the optical memory path to the optical signal path based on received control light.

8. The device of claim 7, wherein the substrate further carries an optical input path coupled between the first optical switch and the optical memory path, and an optical output path coupled between the second optical switch and the optical signal path.

9. The device of claim 7, wherein the substrate further carries a first optical control port configured to receive control light and a first optical control path coupled between the optical control port and the first optical switch.

10. The device of claim 9, wherein the substrate further carries a second optical control port configured to receive control light and a second optical control path coupled between the optical control port and the second optical switch.

11. The device of claim 1, wherein the substrate further carries an optical control port and an optical control path coupled between the optical control port and the optical read/write controller.

12. The device of claim 1, further comprising an optical signal amplifier in the optical memory loop.

13. The device of claim 1, wherein the optical memory loop comprises a looped optical fiber.

14. An optical signal storage device, comprising:

an input optical port;

an output optical port;

an optical memory loop; and an optical read/write controller coupled between the optical memory loop and the input and output optical ports and comprising at least one saturable absorber optical switch having a transmittance that varies nonlinearly with received light intensity so that light is selectively transmittable between the optical memory loop and the input and output optical ports based on received control light.

15. The device of claim 14, further comprising a substrate carrying an optical signal path coupled between the input and output optical ports and an optical memory path coupled to complete the optical memory loop.

16. The device of claim 15, wherein the substrate further carries an optical control port and an optical control path coupled between the optical control port and the saturable absorber optical switch.

17. The device of claim 14, wherein the saturable absorber optical switch is coupled between the optical signal path and the optical memory path and is operable to selectively pass optical signals between optical memory loop and the input and output optical ports based on received control light.

18. The device of claim 14, wherein the optical read/write controller comprises:

a first saturable absorber optical switch coupled between the optical memory loop and the input optical port and is operable to selectively pass optical signals from the input optical port to the optical memory loop based on received control light; and a second saturable absorber optical switch coupled between the optical memory loop and the output port and operable to selectively pass optical signals from the optical memory loop to the output port based on received control light.

19. The device of claim 18, further comprising a substrate carrying an optical signal path coupled between the input and output optical ports, an optical memory path coupled to complete the optical memory loop, an optical input path coupled between the first saturable absorber optical switch and the optical memory path, and an optical output path coupled between the second saturable absorber optical switch and the optical signal path.

20. The device of claim 19, wherein the substrate further carries a first optical control port configured to receive control light and a first optical control path coupled between the optical control port and the first optical switch.

21. The device of claim 20, wherein the substrate further carries a second optical control port configured to receive control light and a second optical control path coupled between the optical control port and the second optical switch.

22. The device of claim 14, further comprising an optical signal amplifier in the optical memory loop.

23. The device of claim 14, wherein the optical memory loop comprises a looped optical fiber.

* * * * *